United States Patent
Koyama

(10) Patent No.: US 9,378,777 B2
(45) Date of Patent: Jun. 28, 2016

(54) BACK GATE BIAS VOLTAGE CONTROL OF OXIDE SEMICONDUCTOR TRANSISTOR

(71) Applicant: Semiconductor Energy Laboratory Co., Ltd., Atsugi-shi, Kanagawa-ken (JP)

(72) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/641,733

(22) Filed: Mar. 9, 2015

(65) Prior Publication Data
US 2015/0263175 A1 Sep. 17, 2015

(30) Foreign Application Priority Data

Mar. 12, 2014 (JP) .................. 2014-048276

(51) Int. Cl.
*G11C 5/14* (2006.01)
*H01L 29/786* (2006.01)
*G11C 11/24* (2006.01)
(Continued)

(52) U.S. Cl.
CPC ............... *G11C 5/146* (2013.01); *G11C 11/24* (2013.01); *G11C 16/3418* (2013.01); *G11C 19/28* (2013.01); *H01L 29/7869* (2013.01); *G11C 7/12* (2013.01)

(58) Field of Classification Search
CPC .............. G11C 7/06; G11C 7/12; G11C 7/22; G11C 11/24; G11C 19/28; G11C 5/146; H01L 29/7869; H01L 28/78693
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 202818097 U 3/2013
CN 103178826 A 6/2013
(Continued)

OTHER PUBLICATIONS

International Search Report (Application No. PCT/IB2015/051598) Dated Jun. 16, 2015.
(Continued)

*Primary Examiner* — Harry W Byrne
*Assistant Examiner* — Lance Reidlinger
(74) *Attorney, Agent, or Firm* — Fish & Richardson P.C.

(57) ABSTRACT

To stably control a threshold voltage of a functional circuit using an oxide semiconductor. A variable bias circuit, a monitoring oxide semiconductor transistor including a back gate, a current source, a differential amplifier, a reference voltage source, and a functional circuit which includes an oxide semiconductor transistor including a back gate are provided. The current source supplies current between a source and a drain of the monitoring oxide semiconductor transistor to generate a gate-source voltage in accordance with the current. The differential amplifier compares the voltage with a voltage of the reference voltage source, amplifies a difference, and outputs a resulting voltage to the variable bias circuit. The variable bias circuit is controlled by an output of the differential amplifier and supplies voltage to the back gate of the monitoring oxide semiconductor transistor and the back gate of the oxide semiconductor transistor included in the functional circuit.

8 Claims, 14 Drawing Sheets

(51) Int. Cl.
*G11C 19/28* (2006.01)
*G11C 16/34* (2006.01)
*G11C 7/12* (2006.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,508,256 B2 | 8/2013 | Yakubo et al. |
| 8,659,346 B2 | 2/2014 | Ogawa |
| 8,861,288 B2 | 10/2014 | Ohshima |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2011/0012672 A1 | 1/2011 | Ogawa |
| 2011/0089417 A1 | 4/2011 | Yamazaki et al. |
| 2011/0101351 A1 | 5/2011 | Yamazaki |
| 2011/0102409 A1 | 5/2011 | hayakawa |
| 2011/0194331 A1 | 8/2011 | Kawae et al. |
| 2011/0304311 A1 | 12/2011 | Takahashi et al. |
| 2012/0049829 A1 | 3/2012 | Murakami |
| 2012/0161139 A1 | 6/2012 | Endo et al. |
| 2012/0293210 A1 | 11/2012 | Yakubo et al. |
| 2013/0163350 A1 | 6/2013 | Ohshima |

FOREIGN PATENT DOCUMENTS

| | | |
|---|---|---|
| DE | 102012224361 | 6/2013 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-023490 A | 2/2011 |
| JP | 2011-181167 A | 9/2011 |
| JP | 2013-009364 A | 1/2013 |
| JP | 2013-150313 A | 8/2013 |
| KR | 2013-0073825 A | 7/2013 |
| TW | 201308337 | 2/2013 |
| TW | 201338424 | 9/2013 |
| WO | WO-2004/114391 | 12/2004 |
| WO | WO-2010/134516 | 11/2010 |

OTHER PUBLICATIONS

Written Opinion (Application No. PCT/IB2015/051598) Dated Jun. 16, 2015.

(56) References Cited

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers. May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

(56) References Cited

OTHER PUBLICATIONS

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

FIG. 8A
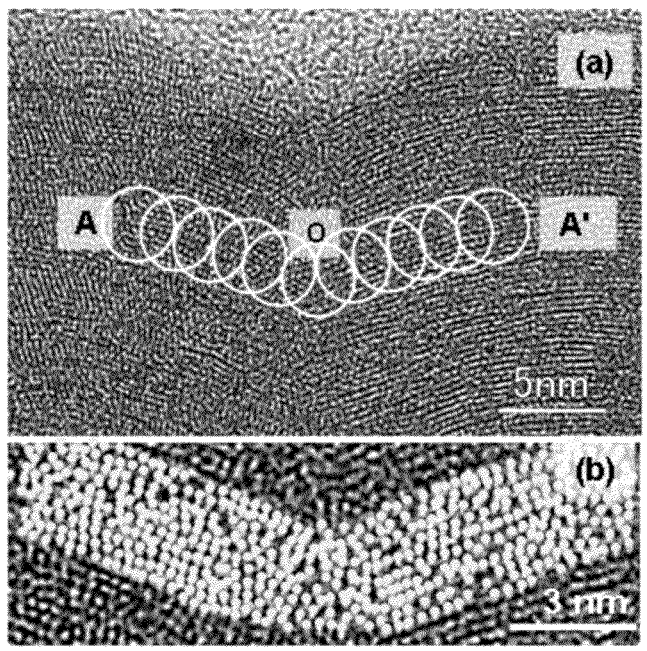
FIG. 8B
FIG. 8C
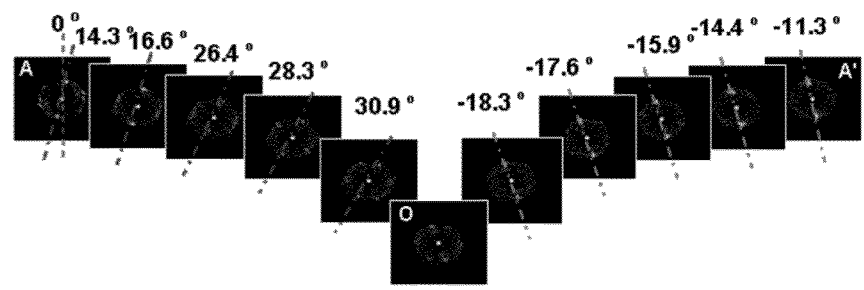

CAAC-OS nc-OS

□ non-CAAC   ⊟ CAAC as-sputtered heat treatment at 450 °C

BACK GATE BIAS VOLTAGE CONTROL OF OXIDE SEMICONDUCTOR TRANSISTOR

TECHNICAL FIELD

The present invention relates to a semiconductor device which includes an oxide semiconductor transistor including a back gate, particularly, a semiconductor device having a function of automatically controlling voltage applied to a back gate. The present invention relates to an electronic device including the semiconductor device.

BACKGROUND ART

Memories such as an SRAM and a DRAM have already been used in a variety of electronic devices. For example, an SRAM or a DRAM is widely used as a cache memory. A cache memory is used in a central processing unit (CPU), a hard disk drive (HDD), a solid state drive (SSD), or the like. A cache memory is provided to input or output data to a logic circuit quickly.

Although an example of nonvolatile memories includes a flash memory, response speed of a flash memory is low. As a novel memory, a memory using an oxide semiconductor has been proposed.

The off-state current of a transistor using an oxide semiconductor is extremely low. For example, the off-state current per micrometer of the channel width at 85° C. is less than or equal to 100 yA (1 yA (yoctoampere) is $1 \times 10^{-24}$ A). Thus, a memory element which can store data for a long period can be formed using a storage capacitor and an oxide semiconductor transistor (e.g., Patent Document 1).

A technique of controlling a threshold voltage of an oxide semiconductor transistor is still under development. In the case where the threshold voltage is shifted in the negative direction, the off-state current is increased at Vg=0 V. Owing to the shift in the threshold voltage, a data retention period is shortened. Therefore, in view of this point, the technique of controlling a threshold voltage is required for lengthening a data retention period.

REFERENCE

Patent Document

[Patent Document 1] Japanese Published Patent Application No. 2011-181167

DISCLOSURE OF INVENTION

Since an oxide semiconductor transistor has an extremely low off-state current, the oxide semiconductor transistor can be used for a nonvolatile memory utilizing such a characteristic. On the other hand, controlling a threshold voltage of an oxide semiconductor transistor is difficult. As a method for controlling a threshold voltage, the following method is known: a back gate is formed in an oxide semiconductor transistor and voltage thereof is controlled so that a threshold voltage is changed. However, in the case where a back gate voltage is fixed, a problem of variations in transistor characteristics or a change in threshold voltages of transistors caused by temperature characteristics occurs.

An object of the present invention is to provide a semiconductor device having a function of applying an appropriate potential to a back gate of an oxide semiconductor transistor automatically. Another object of the present invention is to provide an electronic device including a semiconductor device having a function of applying an appropriate potential to a back gate of an oxide semiconductor transistor automatically.

Another object of the present invention is to provide a semiconductor device having a stable threshold voltage of an oxide semiconductor transistor even when a usage environment of the semiconductor device, e.g., temperature, is changed. Another object of the present invention is to provide a semiconductor device having a stable threshold voltage of an oxide semiconductor transistor even when a variation in transistor characteristics occurs in a manufacturing process. Another object of the present invention is to provide a semiconductor device in which an off-state current can be controlled stably.

One embodiment of the invention disclosed in this specification achieves at least one of the above objects.

A semiconductor device of one embodiment of the present invention includes a variable bias circuit, a first transistor including a back gate, a current source, a differential amplifier, a reference voltage source, and a functional circuit. The functional circuit includes a second transistor including a back gate. The first transistor and the second transistor include an oxide semiconductor. The current source supplies current between a drain and a source of the first transistor to generate a gate-source voltage in accordance with the current. The differential amplifier compares the gate-source voltage of the first transistor and a voltage of a reference voltage source, amplifies a difference, and outputs the resulting voltage. The variable bias circuit is controlled by the output voltage or an output current of the differential amplifier and supplies voltage to the back gate of the first transistor and the back gate of the second transistor.

In the semiconductor device of one embodiment of the present invention, the variable bias circuit may include a pulse width modulation (PWM) wave generation circuit.

In the semiconductor device of one embodiment of the present invention, the functional circuit may be a memory circuit.

In the semiconductor device of one embodiment of the present invention, the functional circuit may be a register circuit.

By the control operation of the present invention, a semiconductor device in which a shift in the threshold voltage of an oxide semiconductor transistor caused by temperature or a variation in transistor characteristics is less likely to occur can be provided. A semiconductor device in which an off-state current of an oxide semiconductor transistor can be stably controlled without being affected by temperature or a variation in transistor characteristics can be provided.

A memory device or a semiconductor device with less power consumption can be provided. A memory device or a semiconductor device capable of high speed operation can be provided.

BRIEF DESCRIPTION OF DRAWINGS

In the accompanying drawings:

FIGS. 8A to 8C are cross-sectional TEM images and a local Fourier transform image of an oxide semiconductor;

BEST MODE FOR CARRYING OUT THE INVENTION

Figure 1:
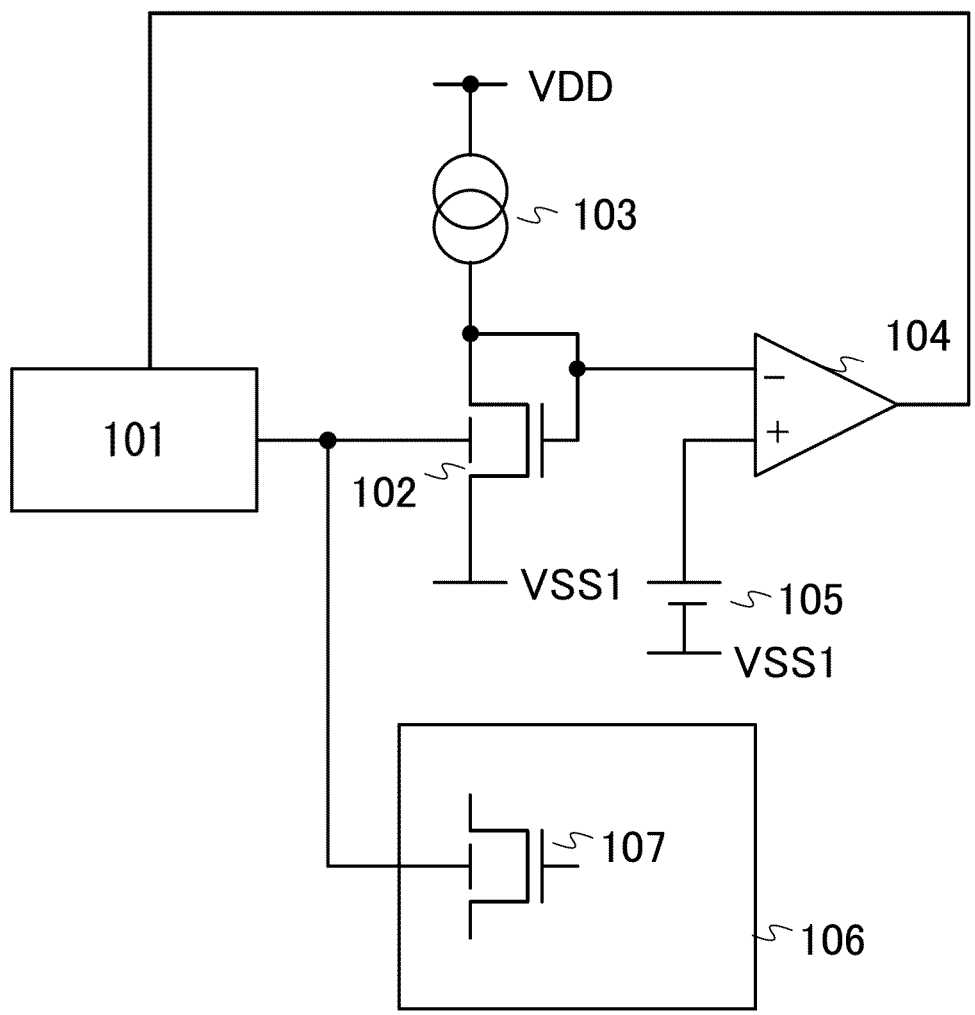
FIG. 1 is a block diagram of a semiconductor device of the present invention.

Examples of embodiments of the present invention will be described below with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

A transistor is a kind of semiconductor element and can achieve amplification of current or voltage, switching operation for controlling conduction or non-conduction, or the like. A transistor in this specification includes an insulated-gate field effect transistor (IGFET) and a thin film transistor (TFT).

Note that the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Embodiment 1

FIG. 1 is a block diagram of a semiconductor device of one embodiment of the present invention. The semiconductor device of one embodiment of the present invention includes a variable bias circuit 101, a transistor 102 for monitoring a threshold voltage, a current source 103, a differential amplifier 104, a reference voltage source 105, a functional circuit 106 using an oxide semiconductor, and an oxide semiconductor transistor 107. Here, the functional circuit 106 is a circuit which includes the oxide semiconductor transistor 107 having a controlled back gate, and is generally a memory, an arithmetic circuit, an amplifier circuit, or the like; however, one embodiment of the present invention is not limited thereto.

Components will be described below. The variable bias circuit 101 is a voltage-controlled voltage source which is controlled by an input voltage and generates voltage to be applied to a back gate (back gate control voltage Vbg). The transistor 102 for monitoring a threshold voltage is an oxide semiconductor transistor having a structure similar to that of an oxide semiconductor transistor including a back gate which is used as the functional circuit, and it is preferable that these transistors have similar gate lengths and gate widths as well as structures. The current source 103 is a constant current source, and a change due to temperature and power source voltage is preferably small. The reference voltage source 105 is a constant voltage source and is preferably less likely to be affected by temperature and power source voltage. The differential amplifier 104 amplifies a voltage difference between a non-inverting input voltage and an inverting input voltage and outputs the resulting voltage. The differential amplifier 104 may be used for a current output and the variable bias circuit 101 may be used for a current input.

Figure 2:
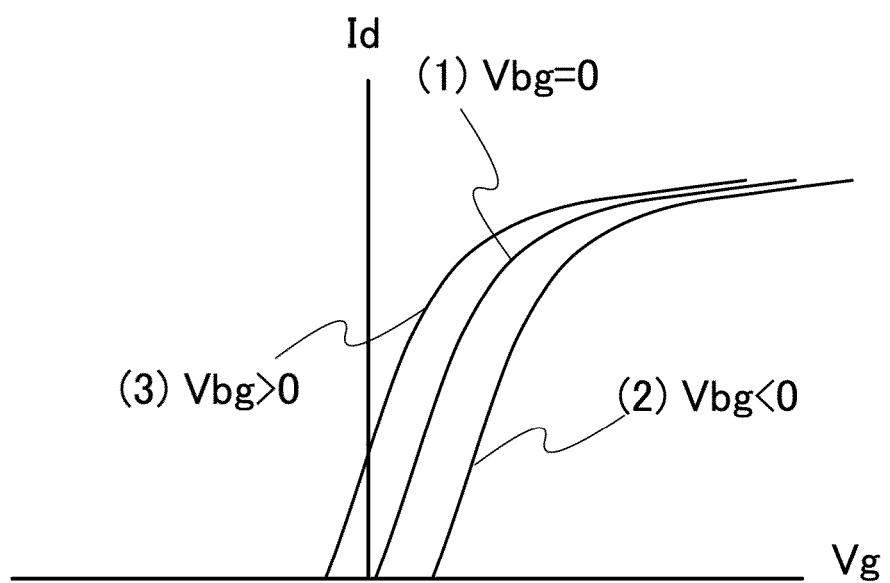
FIG. 2 is a graph showing Id-Vg characteristics of an oxide semiconductor transistor.

The operation of the present invention is described below. An n-channel oxide semiconductor transistor is assumed. Since the polarity is reversed in the case of a p-channel transistor, the following operation of the transistor is also reversed. In the case where a voltage applied to the back gate is positive in the n-channel transistor, the threshold voltage of the transistor is shifted in the negative direction, and in the case where the voltage applied to the back gate is negative, the threshold voltage of the transistor is shifted in the positive direction. In the case where an oxide semiconductor is used for a memory, the threshold voltage is preferably shifted in the positive direction sufficiently. This is because when the threshold voltage is negative, current flows through a drain even at Vg=0 V and it is difficult to retain data in the case where an oxide semiconductor is used for a memory. FIG. 2 shows Id-Vg characteristics of an oxide semiconductor transistor. The threshold voltage is changed depending on the back gate control voltage Vbg.

When the voltage of the reference voltage source 105 is Vref and the gate voltage Vg of the oxide semiconductor transistor 102 is lower than Vref, the differential amplifier 104 operates so that the output voltage is increased. Owing to this voltage, the variable bias circuit 101 operates so that the back gate control voltage Vbg is shifted in the negative direction. When Vbg is shifted in the negative direction, the threshold voltage of the oxide semiconductor transistor 102 is increased, so that Vg of the oxide semiconductor transistor 102 is increased. In the case where the gate voltage Vg of the oxide semiconductor transistor 102 is higher than Vref, the differential amplifier 104 operates so that the output voltage is decreased. Owing to this voltage, the variable bias circuit 101 operates so that the back gate control voltage Vbg is shifted in the positive direction. When Vbg is shifted in the positive direction, the threshold voltage of the oxide semiconductor transistor 102 is decreased, so that Vg of the oxide semiconductor transistor 102 is decreased. In this manner, the circuit operates so that negative feedback is performed.

As described first, the oxide semiconductor transistors 102 and 107 have the same structure and thus have similar electrical characteristics. By controlling the characteristics of the oxide semiconductor transistor 102, the characteristics of the oxide semiconductor transistor 107 to which the same back gate control voltage Vbg is applied is also controlled. In this manner, threshold voltages of oxide semiconductor transistors included in the functional circuit 106 can be controlled and off-state currents thereof can also be controlled.

Embodiment 2

Figure 3:
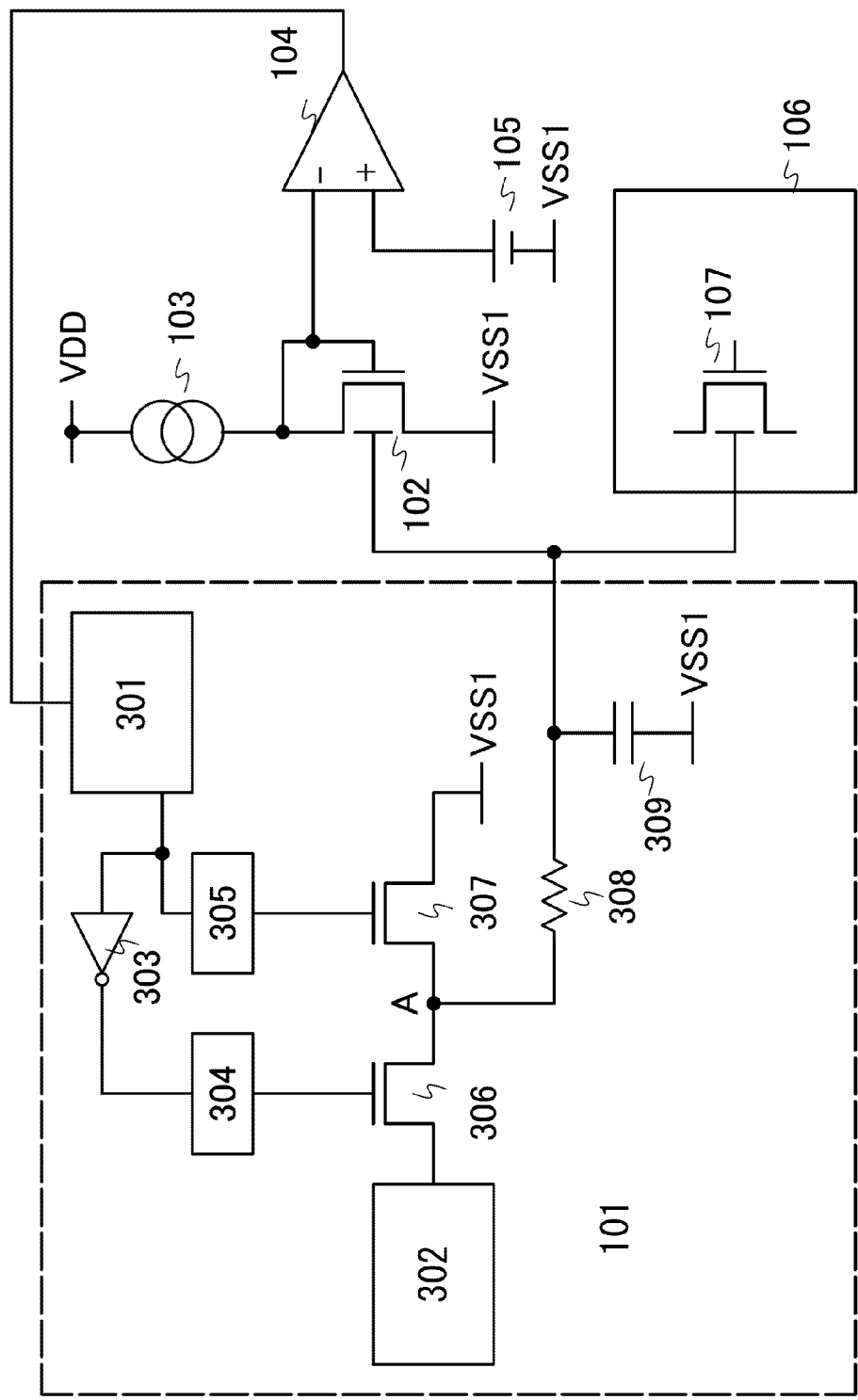
FIG. 3 is a block diagram of a semiconductor device of the present invention.

FIG. 3 is a more specific block diagram of the variable bias circuit 101. The variable bias circuit illustrated in FIG. 3 includes a PWM wave generation circuit 301, a constant voltage circuit 302, an inverter 303, level shifters 304 and 305, switch transistors 306 and 307, a resistor 308, and a capacitor 309. The PWM wave generation circuit 301 is a signal generation circuit capable of controlling a duty ratio in accordance with an input voltage.

The PWM wave generation circuit 301 is controlled by the output voltage of the differential amplifier 104; when the output voltage of the differential amplifier 104 is increased, a period during which the output of the PWM wave generation circuit 301 is at a high level is short, and when the output voltage of the differential amplifier 104 is decreased, a period during which the output of the PWM wave generation circuit 301 is at a low level is short. The output of the PWM wave generation circuit 301 is connected to a gate of the switch transistor 307 through the level shifter 305, and is connected to a gate of the switch transistor 306 through the inverter 303 and the level shifter 304. One of a source and a drain of the switch transistor 306 is connected to the constant voltage circuit 302. The other of the source and the drain of the switch transistor 306 is connected to one terminal of the resistor 308 and one of a source and a drain of the switch transistor 307.

The other of the source and the drain of the switch transistor 307 is connected to a low-potential power source VSS1. The other terminal of the resistor 308 is connected to back gates of the transistors 102 and 107 and the capacitor 309. A connection point A is alternately connected to the constant voltage circuit 302 and VSS1, and a low-pass filter is formed using the resistor 308 and the capacitor 309; thus, a voltage substantially equal to the DC voltage is input to the back gates of the transistors 102 and 107. In accordance with the ratio of the operations of the switch transistors 306 and 307, a voltage between the voltage of the constant voltage circuit 302 and VSS1 is applied as the back gate voltage.

In the case of an oxide semiconductor transistor, the threshold voltage is likely to be shifted in the negative direction. To overcome that, the threshold voltage is often controlled by applying a negative voltage to the back gate. Thus, in the case where VSS1 is set to GND, the constant voltage circuit 302 supplies a negative voltage in many cases. Generating a negative voltage using a bulk silicon transistor might be difficult in terms of isolation. In that case, the constant voltage circuit 302 and the switch transistors 306 and 307 are preferably formed using an oxide semiconductor transistor.

Figure 4:
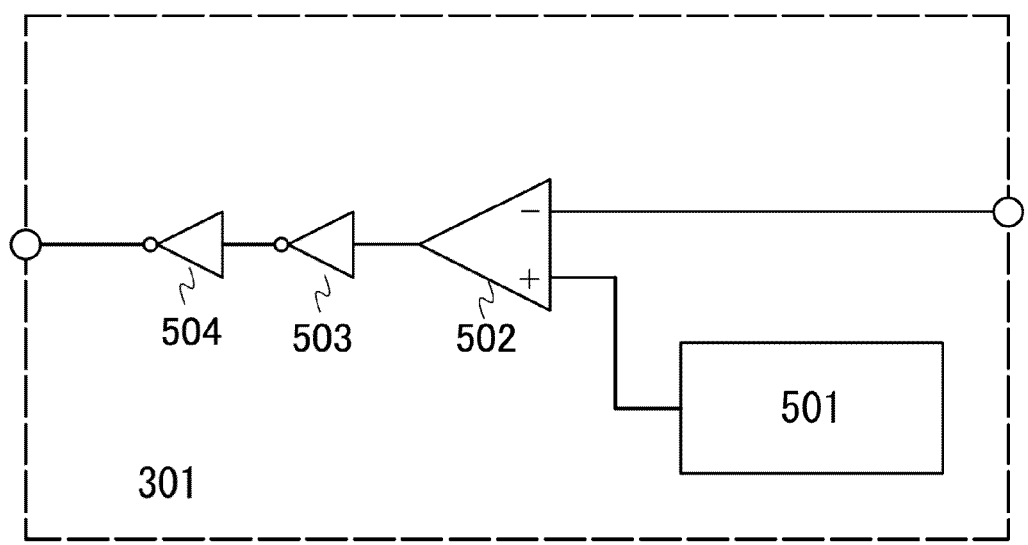
FIG. 4 is a block diagram of a PWM wave generation circuit.

FIG. 4 is a block diagram of the PWM wave generation circuit 301. The PWM wave generation circuit 301 includes a triangle wave generation circuit 501, a comparator 502, and inverter buffers 503 and 504. An inverter buffer is not necessarily provided.

Figure 5:
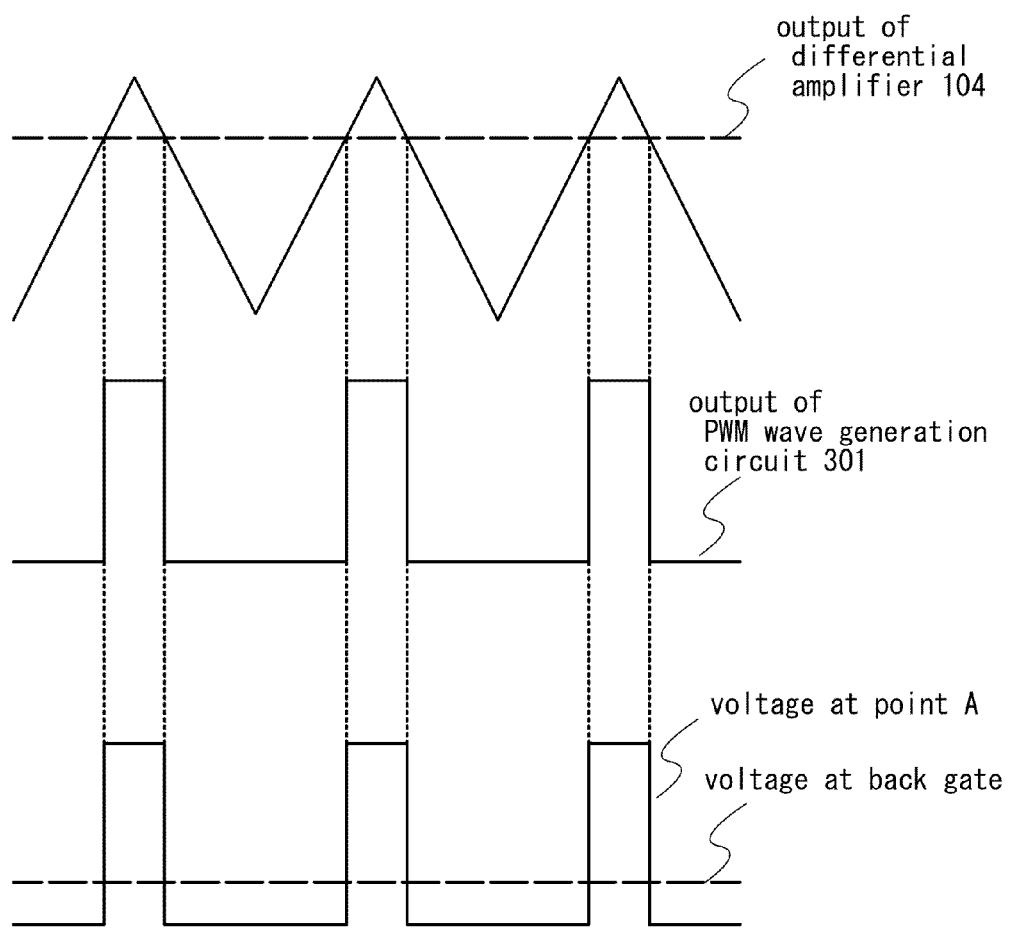
FIG. 5 shows an operation of a PWM wave generation circuit.

FIG. 5 shows operations of the PWM wave generation circuit 301 and the switch transistors 306 and 307. A triangular wave is input from the triangle wave generation circuit 501 to a non-inverting input of the comparator 502. An output of the differential amplifier 104 is input to an inverting input of the comparator 502.

The PWM wave generation circuit 301 outputs a high signal in a period during which the voltage of the triangular wave is higher than the output voltage of the differential amplifier 104. The PWM wave generation circuit 301 outputs a low signal in a period during which the voltage of the triangular wave is lower than the output voltage of the differential amplifier 104. In the case where the output signal of the PWM wave generation circuit 301 is high, the switch transistor 307 is turned on and the connection point A is connected to VSS1. In the case where the output signal of the PWM wave generation circuit 301 is low, the switch transistor 306 is turned on and the connection point A is connected to the output of the constant voltage circuit 302. At the connection point A, two potentials are alternately generated in this manner, and a smoothed voltage is input to the back gate through the low-pass filter formed using the resistor 308 and the capacitor 309. In this manner, a voltage is applied to the back gate so that the threshold voltage of the oxide semiconductor transistor 102 is always a particular voltage, and a threshold voltage stable to temperature can be obtained.

Embodiment 3

Figure 6:
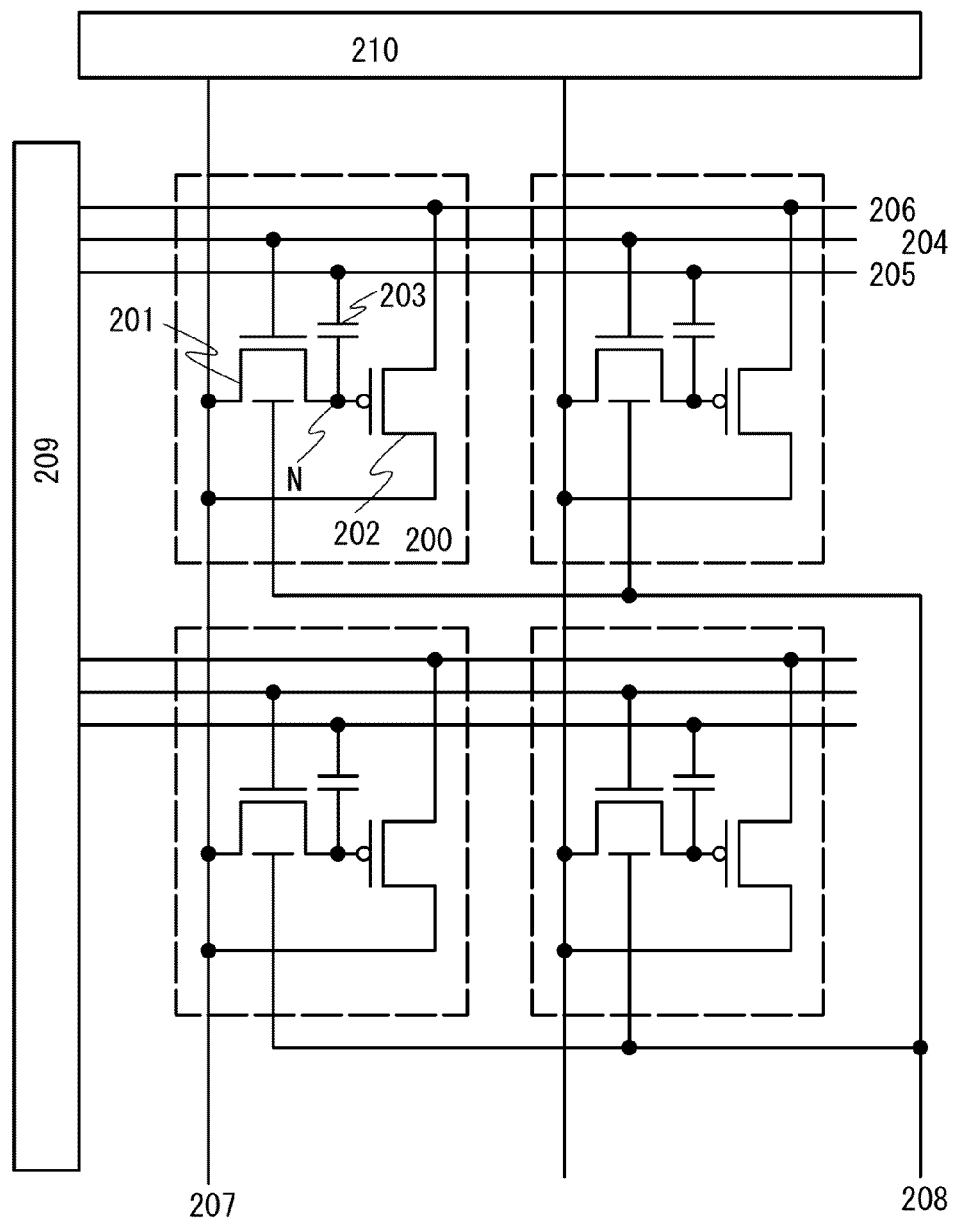
FIG. 6 is a diagram in which the present invention is applied to a memory circuit.

FIG. 6 shows an example in which an oxide semiconductor transistor is used for a memory circuit. The memory cell 200 includes a write transistor 201, a read transistor 202, and a storage capacitor 203. The case where the write transistor 201 is an oxide semiconductor transistor and the read transistor 202 is a p-channel Si transistor is described. The read transistor 202 may be an n-channel Si transistor or an oxide semiconductor transistor. Note that the memory circuit in this embodiment corresponds to the functional circuit 106 in the above embodiment, and the write transistor 201 corresponds to the oxide semiconductor transistor 107 described in the above embodiment.

A gate of the write transistor 201 is connected to a word line 204, and one of a source and a drain of the write transistor 201 is connected to a gate of the read transistor 202 and one electrode of the storage capacitor 203. The other electrode of the storage capacitor 203 is connected to a capacitor word line 205. A source of the read transistor 202 is connected to a source line 206. A drain of the read transistor 202 and the other of the source and the drain of the write transistor 201 are connected to a bit line 207. A back gate of the write transistor 201 is connected to a back gate bias line 208. The word line 204, the capacitor word line 205, and the source line 206 are controlled by a driver circuit 209, and the bit line 207 is controlled by a driver circuit 210.

The operation of the memory circuit in this embodiment is described below. The write operation in this embodiment is performed as follows. First, the case where a high signal is stored in the memory cell 200 is described. A high signal is supplied from the driver circuit 210 to the bit line 207. Next, the word line 204 is set to a high level, and the capacitor word line 205 is set to a low level. When the word line 204 is set to a high level, the write transistor 201 is turned on and data of the bit line 207 is stored at a node N. In this case, the source line 206 remains low so that the read transistor 202 does not operate. In rows in which writing is not performed, the word lines 204 are set to a low level and the capacitor word lines 205 are set to a high level.

Next, the case where a low signal is stored in the memory cell 200 is described. A low signal is supplied from the driver circuit 210 to the bit line 207. Next, the word line 204 is set to a high level, and the capacitor word line 205 is set to a low level. When the word line 204 is set to a high level, the write transistor 201 is turned on and data of the bit line 207 is stored at the node N. In this case, the source line 206 remains low so that the read transistor 202 does not operate. In rows in which writing is not performed, the word lines 204 are set to a low level and the capacitor word lines 205 are set to a high level. Thus, desired data is written to the node N.

The case where data is read from the memory cell 200 is described. First, the bit line 207 is precharged to an intermediate potential. Next, the capacitor word line 205 is set to a low level, and the source line 206 is set to a high level. Since the read transistor 202 is not turned on when a high signal is stored at the node N, the potential of the bit line 207 is not changed from the precharge potential. When a low signal is stored at the node N, the read transistor 202 is turned on and current flows from the source line 206 to the bit line 207, so that the potential of the bit line 207 becomes higher than the precharge potential. By detecting the increased amount, whether the potential of the node N is low or not can be determined. In such a manner, data stored in the memory cell 200 can be read.

In rows in which reading is not performed, the capacitor word lines 205 are set to a high level and the source lines 206 are set to a low level, so that the read transistors 202 in the rows in which reading is not performed can be turned off; thus, reading can be selectively performed.

In the memory circuit, the assurance of memory properties depends on the length of a period during which charges can be held at the node N. A nonvolatile memory requires data holding for 10 years, and the retention characteristic is an important factor.

There are four possibilities that charges are leaked. First, current flows to the word line 204 through a gate insulating film of the write transistor 201. Secondly, current flows to the capacitor word line 205 through the storage capacitor 203. Thirdly, current flows to the bit line 207 or the source line 206 through a gate insulating film of the write transistor 201. Fourthly, current flows to the bit line 207 as a drain current of the write transistor 201.

The first to third possibilities can be excluded by increasing the thickness of the insulating films. To exclude the fourth possibility, the write transistor 201 needs to be definitely turned off, a drain-source current needs to be sufficiently low at Vg=0 V, and the threshold voltage of the write transistor 201 needs to be controlled. The present invention is effective as a measure against them, and a potential such that the write transistor 201 can be sufficiently turned off can be applied to the back gate bias line 208 by the variable bias circuit 101.

Figure 7:
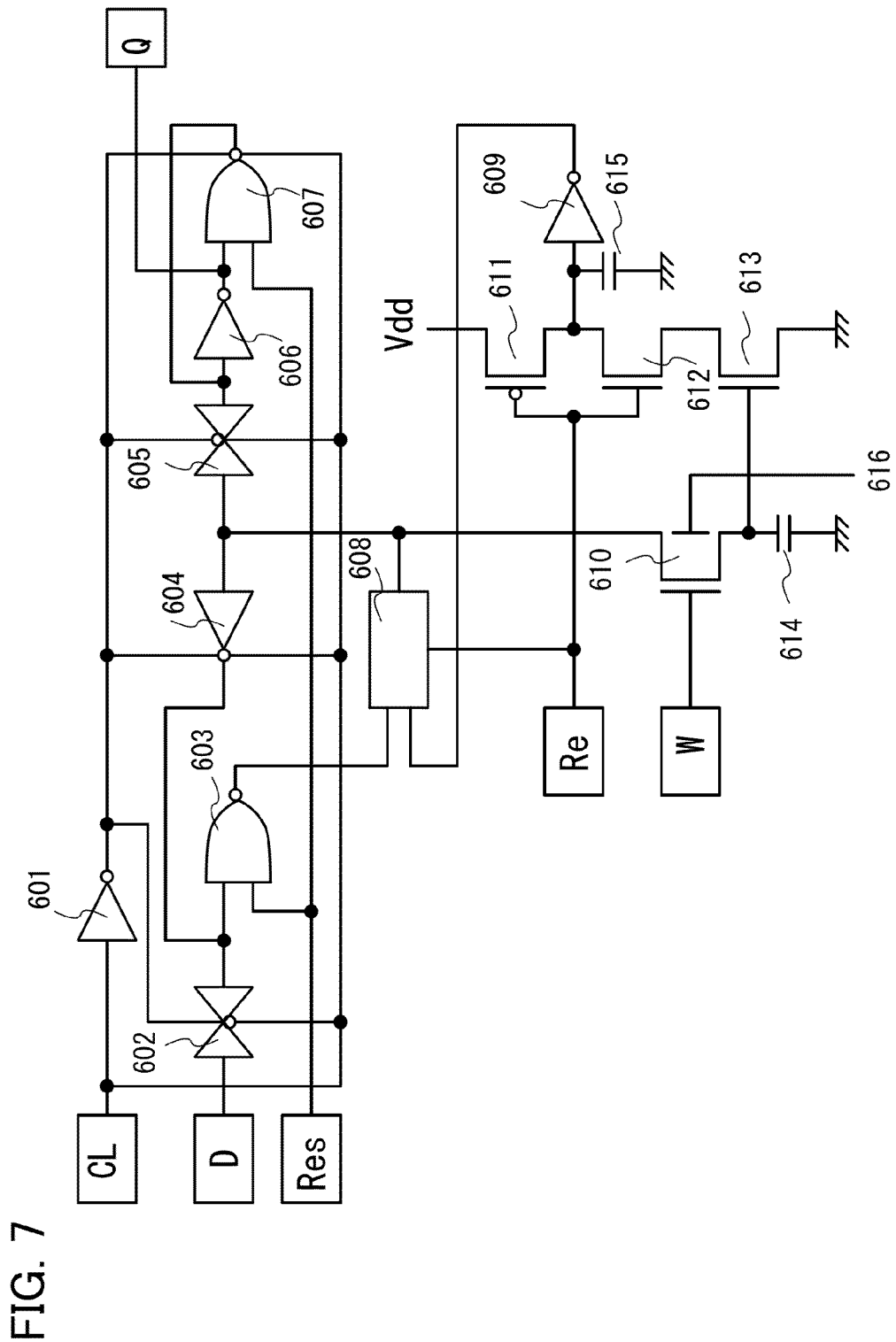
FIG. 7 is a diagram in which the present invention is applied to a register circuit.

FIG. 7 shows an embodiment of a nonvolatile register circuit. Of logic circuits, register circuits are generally used to store data temporarily, but register circuits using oxide semiconductor transistors can store data even when the power is off. In FIG. 7, the nonvolatile register circuit includes an inverter 601, a switch 602, a NAND 603, a clock inverter 604, a switch 605, an inverter 606, a clock NAND 607, a multiplexer 608, an inverter 609, an oxide semiconductor transistor 610, a p-channel transistor 611, n-channel transistors 612 and 613, and capacitors 614 and 615. Unlike general register circuits, the multiplexer 608, the inverter 609, the oxide semiconductor transistor 610, the p-channel transistor 611, the n-channel transistors 612 and 613, and the capacitors 614 and 615 are added to the nonvolatile register circuit.

The operation of the nonvolatile register circuit is described below. When both of a write signal W and a read signal Re are at a low level, the multiplexer 608 outputs an output of the NAND 603 to an input of the clock inverter 604 and an input of the switch 605. Furthermore, the oxide semiconductor transistor 610 is turned off. Thus, a nonvolatile portion does not contribute to the operation.

In data writing, the write signal W is set to a high level, and an output of the multiplexer 608 is written to the capacitor 614. Even when the power is turned off after the write signal W is set to a low level, the data is held in the capacitor 614.

When the power is turned on again and the read signal Re is set to a high level, the data is read from the capacitor 614 and input to the register circuit. The details thereof are described below. In the case where a high signal is stored in the capacitor 614, the transistor 613 is turned on and a drain thereof is changed to a low level. An inverter including the transistors 611 and 612 operates, and a high signal is input to the multiplexer 608 through the inverter 609. When the read signal Re is at a high level, the multiplexer 608 outputs an output of the inverter 609 to the input of the clock inverter 604 and the input of the switch 605; thus, the high signal is returned to the register circuit.

In the case where a low signal is stored in the capacitor 614, the transistors 613 and 612 are turned off. When the power is turned on, the transistor 611 is turned on for a moment, and the potential of the capacitor 615 is set to a high level. A low signal is input to the multiplexer 608 through the inverter 609. Then, the multiplexer 608 outputs a low signal, and the low signal is returned to the register circuit. In such a manner, the nonvolatile register circuit operates. In a CMOS circuit included in the inverter, the NAND, and the like, the p-channel transistor may be a Si transistor and the n-channel transistor may be an oxide semiconductor transistor. In an oxide semiconductor transistor, short-channel effects are less likely to occur, and when the gate length L is miniaturized, a decrease in mobility and a variation in threshold voltages are less likely to occur. The n-channel transistor portion of the CMOS circuit is formed using an oxide semiconductor transistor; thus, frequency characteristics and the like can be improved in miniaturization, compared to the case where the CMOS circuit is formed using only Si transistors. Furthermore, in the case where the CMOS circuit is formed using an oxide semiconductor transistor, the p-channel transistors and the n-channel transistors can be stacked, which enables a reduction in area. In addition, steps such as a doping step for the n-channel transistors are unnecessary, so that manufacturing steps can be reduced.

In a manner similar to that of the embodiment, to retain data for a long period, the oxide semiconductor transistor 610 needs to be sufficiently turned off at Vg=0 V, and a threshold voltage thereof needs to be set to a high level. In FIG. 7, voltage is applied from the variable bias circuit 101 to a back gate of the oxide semiconductor transistor 610 through a wiring 616; thus, the threshold voltage of the oxide semiconductor transistor can be stable. Even when the environment such as temperature is changed, off-state current is not increased and a sufficient retention period can be secured.

As described above, in the present invention, the oxide semiconductor transistors 102 and 107 have similar electrical characteristics when having the same structure. By controlling the characteristics of the oxide semiconductor transistor 102, the characteristics of the oxide semiconductor transistor 107 to which the same back gate control voltage Vbg is applied are also controlled. In this manner, a threshold voltage of an oxide semiconductor transistor included in the functional circuit 106 can be controlled, and an off-state current thereof can also be controlled.

This embodiment can be implemented in combination with any of the other embodiments as appropriate.

Embodiment 4

In this embodiment, an oxide semiconductor layer that can be used as a semiconductor layer of the write transistor (hereinafter, referred to as a first transistor in some cases) with low off-state current described in the above embodiment is described. An oxide semiconductor layer described below can be used as channel layers of transistors other than the first transistor for writing, e.g., a read transistor (hereinafter, referred to as a second transistor in some cases) or transistors used in various circuits in FIG. 1, FIG. 3, FIG. 6, and FIG. 7.

An oxide semiconductor used for a channel formation region in the semiconductor layer of the first transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the first transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, 3:1:2, or 2:1:3, or an oxide with an atomic ratio close to the above atomic ratios can be used.

When the oxide semiconductor film forming the semiconductor layer contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

In this manner, the transistor including an i-type (intrinsic) or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1\times10^{-18}$ A, preferably less than or equal to $1\times10^{-21}$ A, further preferably less than or equal to $1\times10^{-24}$ A; or at 85° C., less than or equal to $1\times10^{-15}$ A, preferably less than or equal to $1\times10^{-18}$ A, further preferably less than or equal to $1\times10^{-21}$ A. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

The oxide semiconductor film may include one or more of an oxide semiconductor having a single-crystal structure (hereinafter referred to as a single-crystal oxide semiconductor), an oxide semiconductor having a polycrystalline structure (hereinafter referred to as a polycrystalline oxide semiconductor), an oxide semiconductor having a microcrystalline structure (hereinafter referred to as a microcrystalline oxide semiconductor), and an oxide semiconductor having an amorphous structure (hereinafter referred to as an amorphous oxide semiconductor). Alternatively, the oxide semiconductor film may be formed using a CAAC-OS film. Alternatively, the oxide semiconductor film may include an amorphous oxide semiconductor and an oxide semiconductor having a crystal grain. Described below are a CAAC-OS and a microcrystalline oxide semiconductor as typical examples.

First, a CAAC-OS film is described.

The CAAC-OS film is an oxide semiconductor film having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 8A is a cross-sectional TEM image of a CAAC-OS film. FIG. 8B is a cross-sectional TEM image obtained by enlarging the image of FIG. 8A. In FIG. 8B, atomic arrangement is highlighted for easy understanding.

FIG. 8C is Fourier transform images of regions each surrounded by a circle (the diameter is approximately 4 nm) between A and O and between O and A' in FIG. 8A. C-axis alignment can be observed in each region in FIG. 8C. The c-axis direction between A and O is different from that between O and A', which indicates that a grain in the region between A and O is different from that between O and A'. In addition, between A and O, the angle of the c-axis continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 9A).

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan-view TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2 $\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. When an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charge trapped by the carrier traps in the oxide semiconductor film takes a long time to be released, and might behave like fixed charge. Thus, the transistor that includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 9B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 9A:
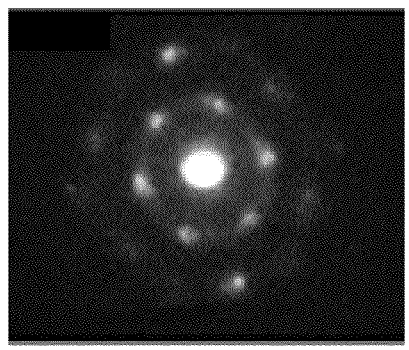
FIGS. 9A and 9B show nanobeam electron diffraction patterns of oxide semiconductor films and FIGS. 9C and 9D illustrate an example of a transmission electron diffraction measurement apparatus.
Figure 9B:
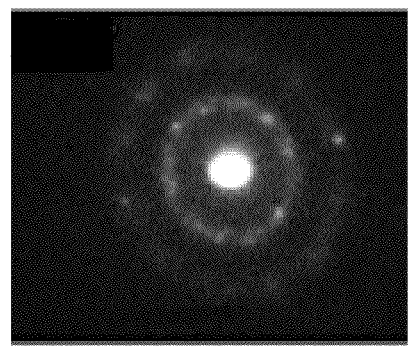
Figure 9C:
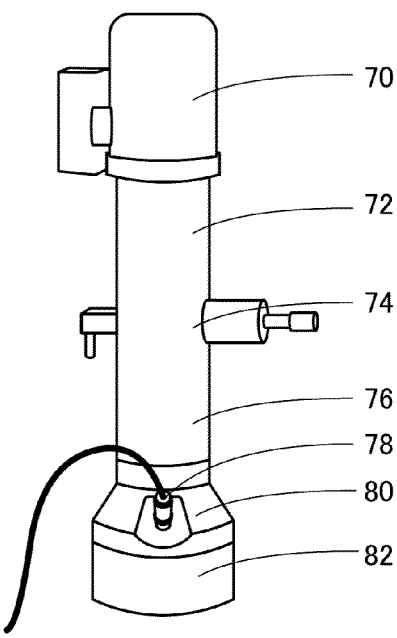

FIG. 9C illustrates a transmission electron diffraction measurement apparatus. The transmission electron diffraction measurement apparatus includes an electron gun chamber 70, an optical system 72 below the electron gun chamber 70, a sample chamber 74 below the optical system 72, an optical system 76 below the sample chamber 74, an observation chamber 80 below the optical system 76, a camera 78 provided for the observation chamber 80, and a film chamber 82 below the observation chamber 80. The camera 78 is provided to face toward the inside of the observation chamber 80. Note that the film chamber 82 is not necessarily provided.

Figure 9D:
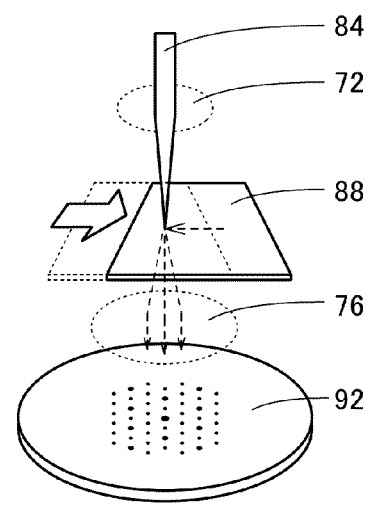

FIG. 9D illustrates the internal structure of the transmission electron diffraction measurement apparatus in FIG. 9C. In the transmission electron diffraction measurement apparatus, a substance 88 which is positioned in the sample chamber 74 is irradiated with electrons emitted from an electron gun installed in the electron gun chamber 70 through the optical system 72. The electrons which have passed through the substance 88 enter a fluorescent plate 92 which is installed in the observation chamber 80 through the optical system 76. On the fluorescent plate 92, a pattern corresponding to the intensity of the incident electron appears, which enables measurement of a transmission electron diffraction pattern.

The camera 78 is installed so as to face the fluorescent plate 92 and can take a picture of a pattern appearing in the fluorescent plate 92. An angle formed by a straight line which passes through the center of a lens of the camera 78 and the center of the fluorescent plate 92 and an upper surface of the fluorescent plate 92 is, for example, 15° or more and 80° or less, 30° or more and 75° or less, or 45° or more and 70° or less. As the angle is reduced, distortion of the transmission electron diffraction pattern taken by the camera 78 becomes larger. Note that if the angle is obtained in advance, the distortion of an obtained transmission electron diffraction pattern can be corrected. Note that the film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 88.

Then, a method for measuring a transmission electron diffraction pattern of a substance by the transmission electron diffraction measurement apparatus described above is described.

For example, changes in the structure of a substance can be observed by changing the irradiation position of the electrons 84 that are a nanobeam on the substance (or by scanning) as illustrated in FIG. 9D. At this time, when the substance 88 is a CAAC-OS film, a diffraction pattern shown in FIG. 9A is observed. When the substance 88 is an nc-OS film, a diffraction pattern shown in FIG. 9B is observed Even when the substance 88 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 10A:
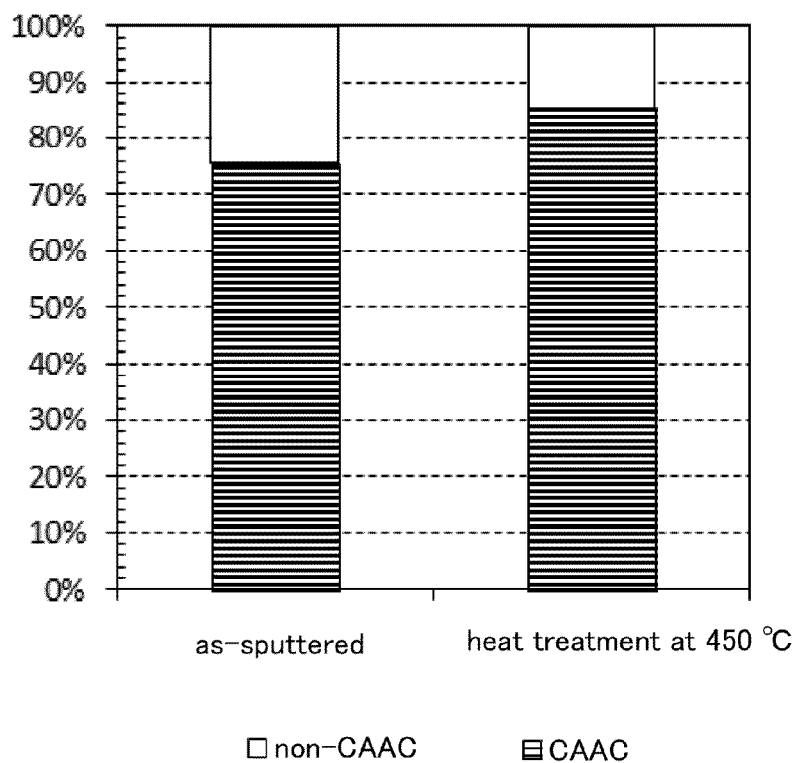
FIG. 10A shows an example of structural analysis by transmission electron diffraction measurement and FIGS. 10B and 10C show plan-view TEM images.

FIG. 10A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 10B:
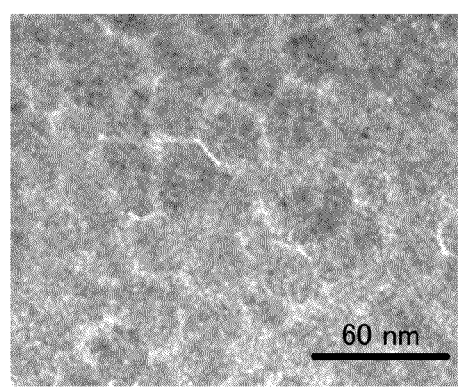
Figure 10C:
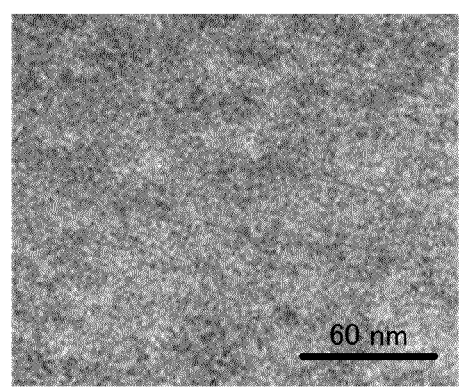

FIGS. 10B and 10C are plan-view TEM images of the CAAC-OS film obtained just after the deposition and the CAAC-OS film subjected to the heat treatment at 450° C., respectively. Comparison between FIGS. 10B and 10C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

This embodiment can be implemented in combination with any of the other embodiments as appropriate.

Embodiment 5

In this embodiment, an example of a cross-sectional structure of a transistor used in a semiconductor device of one embodiment of the disclosed invention is described with reference to drawings.

Figure 11:
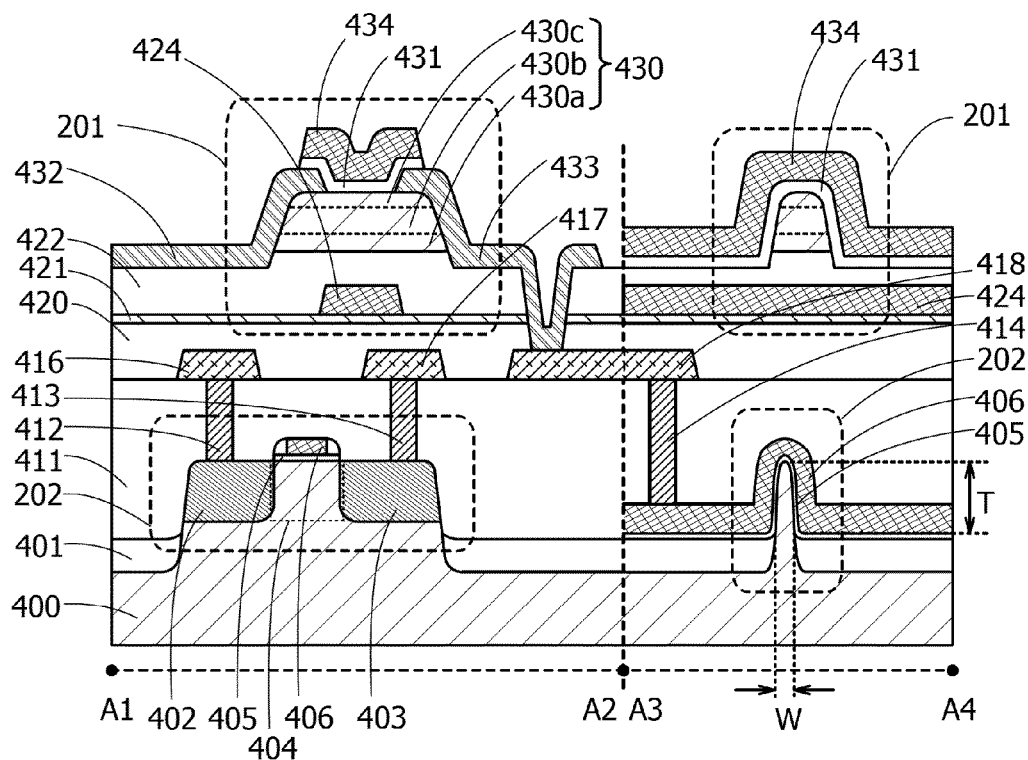
FIG. 11 is a cross-sectional view illustrating an embodiment of the present invention.

FIG. 11 illustrates an example of part of a cross-sectional structure of a circuit portion of one embodiment of the disclosed invention. FIG. 11 illustrates an example of a cross-sectional structure of the first transistor 201 for writing and the second transistor 202 for reading illustrated in FIG. 6 in Embodiment 3. A region along dashed line A1-A2 shows a structure of the first transistor 201 and the second transistor 202 in the channel length direction, and a region along dashed line A3-A4 shows a structure of the first transistor 201 and the second transistor 202 in the channel width direction. Note that in one embodiment of the present invention, the channel length direction of the first transistor 201 does not necessarily correspond to the channel length direction of the second transistor 202.

The channel length direction denotes a direction in which carriers move at the shortest distance between a pair of impurity regions serving as a source region and a drain region. The channel width direction denotes a direction perpendicular to the channel length direction.

FIG. 11 illustrates an example in which the first transistor 201 including a channel formation region in an oxide semiconductor film is formed over the second transistor 202 including a channel formation region in a single crystal silicon substrate. With the structure illustrated in FIG. 11, the first transistor 201 and the second transistor 202 can overlap with each other. Alternatively, the channel formation region of the first transistor 201 and the channel formation region of the second transistor 202 can overlap with each other. Thus, the structure can reduce the layout area of a semiconductor device.

The second transistor 202 may include a channel formation region in a semiconductor film or a semiconductor substrate of silicon, germanium, or the like in an amorphous, microcrystalline, polycrystalline, or single crystal state. Alternatively, the second transistor 202 may include the channel formation region in an oxide semiconductor film or an oxide semiconductor substrate. In the case where the transistors each include a channel formation region in an oxide semiconductor film or an oxide semiconductor substrate, the first transistor 201 is not necessarily stacked over the second transistor 202, and the first transistor 201 and the second transistor 202 may be formed in the same layer.

In the case where the second transistor 202 is formed using a thin silicon film, any of the following can be used in the thin film: amorphous silicon formed by a sputtering method or a vapor phase growth method such as a plasma-enhanced chemical vapor deposition (CVD) method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the second transistor 202 is formed can be, for example, a silicon substrate, a germanium substrate, or a silicon germanium substrate. In FIG. 11, a single crystal silicon substrate is used as the substrate 400.

The second transistor 202 is electrically isolated by element isolation. Trench isolation (e.g., shallow trench isolation (STI)) or the like can be used as the element isolation. In FIG. 11, the second transistor 202 is electrically isolated by trench isolation. Specifically, in FIG. 11, the second transistor 202 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the second transistor 202 and a channel formation region 404 placed between the impurity regions 402 and 403 are provided. The second transistor 202 also includes an insulating film 405 covering the channel formation region 404 and a gate electrode 406 that overlaps the channel formation region 404 with the insulating film 405 placed therebetween.

In the second transistor 202, a side portion and an upper portion of the projection in the channel formation region 404 overlap with the gate electrode 406 with the insulating film 405 positioned therebetween, so that carriers flow in a wide area including the side portion and the upper portion of the channel formation region 404. Thus, the area of the second transistor 202 in the substrate can be small, and the amount of transfer of carriers in the second transistor 202 can be increased. As a result, the on-state current and field-effect mobility of the second transistor 202 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the second transistor 202 can be further increased and the field-effect mobility of the second transistor 202 can be further increased.

Note that in the case of the second transistor 202 formed using a bulk semiconductor substrate, the aspect ratio is preferably 0.5 or more, more preferably 1 or more.

An insulating film 411 is provided over the second transistor 202. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the first transistor 201 is provided over the insulating film 422.

The first transistor 201 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 therebetween. Note that an opening is formed in the insulating films 420 to 422. The conductive film 433 is connected to the conductive film 418 in the opening.

In addition, the first transistor 201 includes, on the side opposite to gate electrode 434, a gate electrode 424 overlapping with the semiconductor film 430 with the insulating film 422 therebetween. The gate electrode 424 functions as, for example, the back gate of the transistor 107 described in the above embodiment.

When the first transistor 201 includes a pair of gate electrodes, a signal for controlling an on state or an off state may be input to one of the gate electrodes, and the other of the gate electrodes may be supplied with a potential from another element. In that case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 11, the first transistor 201 has a single-gate structure in which one channel formation region corresponding to one gate electrode 434 is provided. However, the first transistor 201 may have a multi-gate structure where a plurality of electrically connected gate electrodes are provided so that a plurality of channel formation regions are included in one active layer.

FIG. 11 illustrates an example in which the semiconductor film 430 included in the first transistor 201 includes oxide semiconductor films 430a to 430c that are stacked in this order over the insulating film 422. Note that in one embodiment of the present invention, the semiconductor film 430 of the first transistor 201 may be formed using a single-layer metal oxide film.

The insulating film 422 preferably has a function of supplying part of oxygen to the oxide semiconductor films 430a to 430c by heating. It is preferable that the number of defects in the insulating film 422 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma-enhanced CVD method, a sputtering method, or the like.

Note that in this specification, oxynitride contains more oxygen than nitrogen, and nitride oxide contains more nitrogen than oxygen.

Note that in the first transistor 201 illustrated in FIG. 11, the gate electrode 434 overlaps end portions of the oxide semiconductor film 430b including a channel region that are not overlapped with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the gate electrode 434 because the end portions of the oxide semiconductor film 430b that are not overlapped with the conductive films 432 and 433 are overlapped with the gate electrode 434 in the first transistor 201 illustrated in FIG. 11. Consequently, current that flows between the conductive films 432 and 433 through the end portions of the oxide semiconductor film 430b can be controlled by the potential applied to the gate electrode 434. This structure of the first transistor 201 is referred to as a surrounded channel (s-channel) structure.

With the s-channel structure, specifically, when a potential at which the first transistor 201 is turned off is supplied to the gate electrode 434, the amount of off-state current that flows between the conductive films 432 and 433 through the end portions of the oxide semiconductor film 430b can be reduced. For this reason, in the first transistor 201, even when the distance between the conductive films 432 and 433 at the end portions of the oxide semiconductor film 430b is reduced as a result of reducing the channel length to obtain high on-state current, the first transistor 201 can have low off-state current. Consequently, with the short channel length, the first transistor 201 can have high on-state current when in an on state and low off-state current when in an off state.

With the s-channel structure, specifically, when a potential at which the first transistor 201 is turned on is supplied to the gate electrode 434, the amount of current that flows between the conductive films 432 and 433 through the end portions of the oxide semiconductor film 430b can be increased. The current contributes to an increase in the field-effect mobility and on-state current of the first transistor 201. When the end portions of the oxide semiconductor film 430b are overlapped with the gate electrode 434, carriers flow in a wide region of the oxide semiconductor film 430b without being limited to a region in the vicinity of the interface between the oxide semiconductor film 430b and the gate insulating film 431, which results in an increase in carrier mobility of the first transistor 201. As a result, the on-state current of the first transistor 201 is increased, and the field-effect mobility is increased. Typically, the field-effect mobility is greater than or equal to 10 cm$^2$/V·s or greater than or equal to 20 cm$^2$/V·s. Note that here, the field-effect mobility is not an approximate value of the mobility as the physical property of the oxide semiconductor film but is an index of current drive capability and the apparent field-effect mobility of a saturation region of the transistor.

Figure 12:
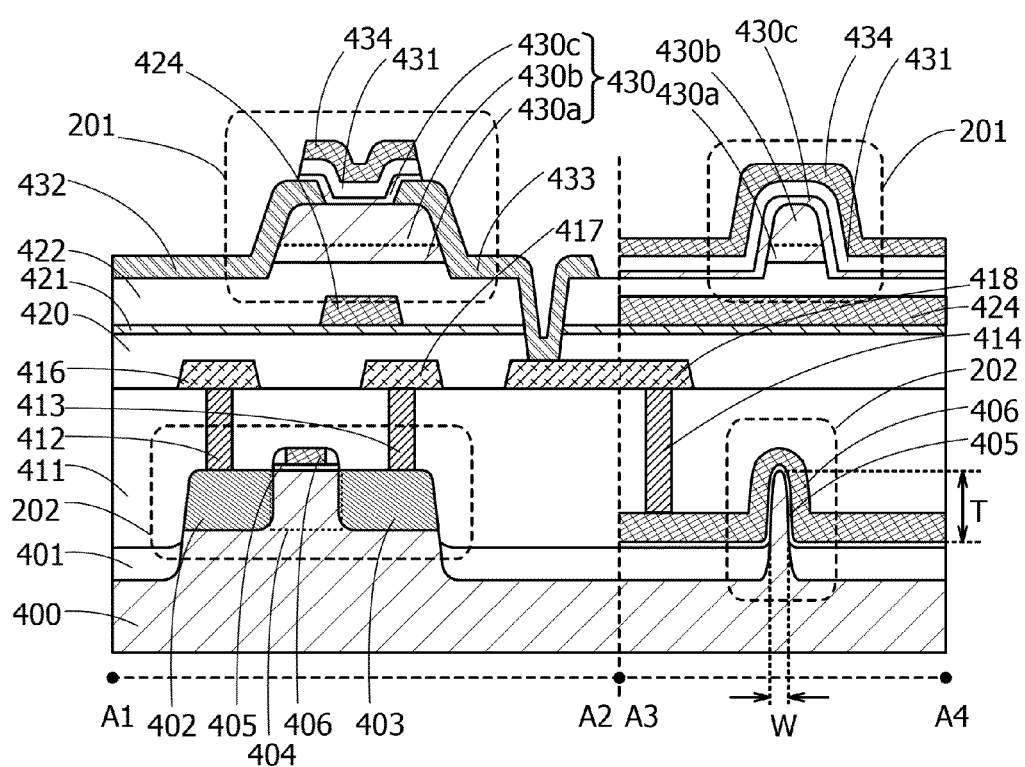
FIG. 12 is a cross-sectional view illustrating an embodiment of the present invention.

Although this embodiment is described with reference to FIG. 11, one embodiment of the present invention is not limited to this structure. For example, as illustrated in FIG. 12, part of the oxide semiconductor film 430c may be provided in contact with upper surfaces of the conductive films 432 and 433.

This embodiment can be implemented in combination with any of the other embodiments as appropriate.

Embodiment 6

Although the conductive film and the semiconductor film described in the above embodiments can be formed by a sputtering method, they may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive film and the semiconductor film which are described in the above embodiment can be formed by a thermal CVD method such as an MOCVD method or an ALD method. For example, in the case where an InGaZnO$_X$ (X>0) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and diethylzinc (chemical formula: $(C_2H_5)_2Zn$) can be used instead of dimethylzinc.

For example, in the case where a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are introduced at a time, so that a tungsten film is formed. Note that an SiH$_4$ gas may be used instead of a B$_2$H$_6$ gas.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Alternatively, a Zn(CH$_3$)$_2$ gas may be used.

This embodiment can be implemented in combination with any of the other embodiments as appropriate.

Embodiment 7

In this embodiment, application examples of the semiconductor device described in the above embodiments to an electronic component and to an electronic device including the electronic component are described with reference to FIGS. 13A and 13B and FIGS. 14A to 14E.

Figure 13A:
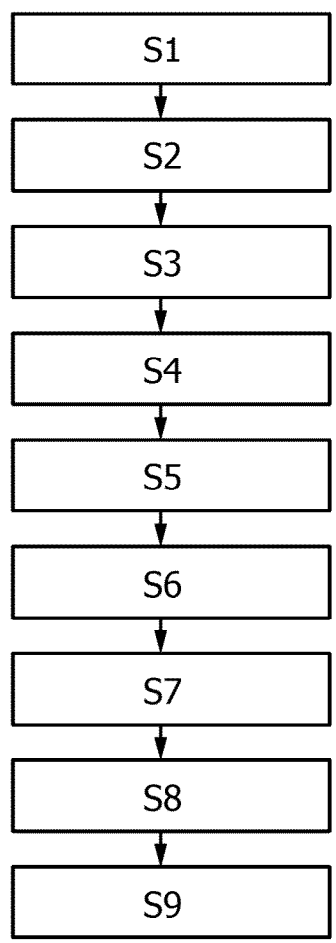
FIG. 13A is a flowchart showing a manufacturing process of an electronic component.

FIG. 13A shows an example where the semiconductor device described in the above embodiments is used to make an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including the transistors illustrated in FIG. 11 of Embodiment 5 is completed by integrating detachable components on a printed circuit board through the assembly process (post-process).

The post-process can be completed through steps shown in FIG. 13A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The above electronic component can include the semiconductor device described in the above embodiments. Thus, the electronic component which achieves reduction in size and cost can be obtained.

Figure 13B:
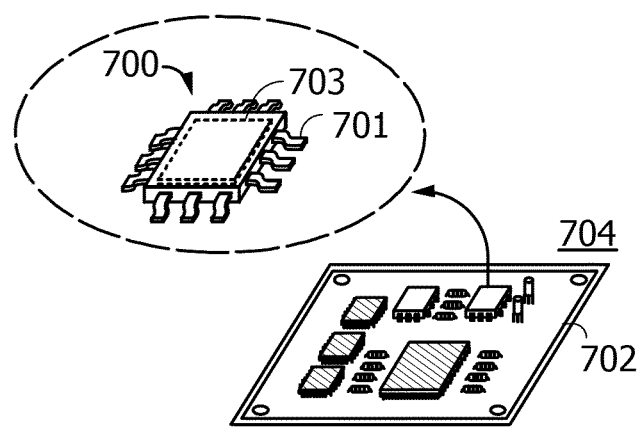
FIG. 13B is a schematic perspective view of the electronic component.

FIG. 13B is a schematic perspective view of the completed electronic component. FIG. 13B is a schematic perspective view illustrating a quad flat package (QFP) as an example of the electronic component. A lead 701 and a circuit portion 703 of an electronic component 700 are illustrated in FIG. 13B. The electronic component 700 in FIG. 13B is, for example, mounted on a printed circuit board 702. When a plurality of electronic components 700 are used in combination and electrically connected to each other over the printed circuit board 702, the electronic components 700 can be mounted on an electronic device. A completed circuit board 704 is provided in the electronic device or the like.

Then, applications of the electronic component to an electronic device such as a computer, a portable information terminal (including a mobile phone, a portable game machine, an audio reproducing device, and the like), electronic paper, a television device (also referred to as a television or a television receiver), or a digital video camera are described.

Figure 14A:
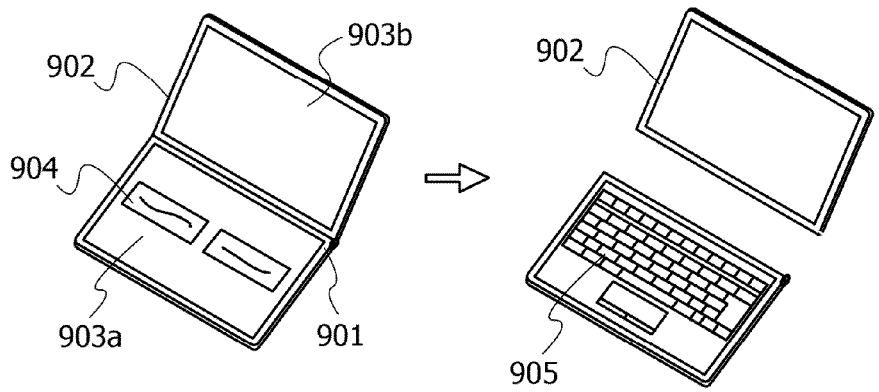
FIGS. 14A to 14E are electronic devices using electronic components.

FIG. 14A illustrates a portable information terminal, which includes a housing 901, a housing 902, a first display portion 903a, a second display portion 903b, and the like. An electronic component including the semiconductor device described in the above embodiments is provided in at least one of the housings 901 and 902. Thus, the portable information terminal can consume less power and operate at high speed.

Note that the first display portion 903a is a panel having a touch input function, and for example, as illustrated in the left of FIG. 14A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 14A. With the keyboard 905, letters can be input quickly by keyboard input as in the case of using a conventional information terminal, for example.

Furthermore, one of the first display portion 903a and the second display portion 903b can be detached from the portable information terminal as illustrated in the right of FIG. 14A. Providing the second display portion 903b with a touch input function makes the information terminal convenient to carry because the weight can be further reduced and the information terminal can operate with one hand while the other hand supports the housing 902.

The portable information terminal in FIG. 14A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 14A may transmit and receive data wirelessly. Through wireless communication, desired book data or the like can be purchased and downloaded from an electronic book server.

Furthermore, the housing 902 in FIG. 14A may have an antenna, a microphone function, or a wireless communication function to be used as a mobile phone.

Figure 14B:
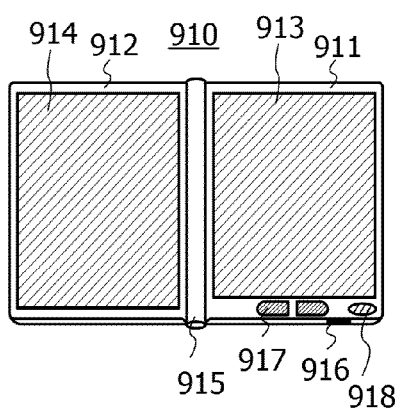

FIG. 14B illustrates an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge portion 915 and can be opened and closed with the hinge portion 915 as an axis. The housing 911 is provided with a power switch 916, an operation key 917, a speaker 918, and the like. An electronic component including the semiconductor device described in the above embodiments is provided in at least one of the housings 911 and 912. Thus, the e-book reader can consume less power and operate at high speed.

Figure 14C:
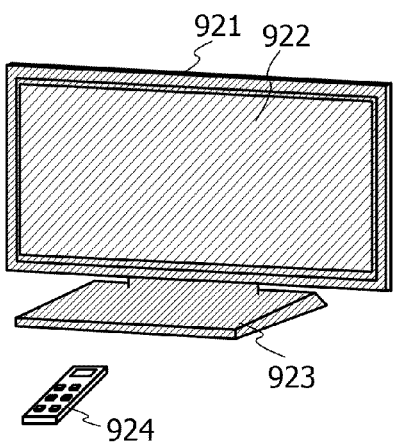

FIG. 14C is a television device, which includes a housing 921, a display portion 922, a stand 923, and the like. The television device 920 can operate with a switch of the housing 921 and a separate remote controller 924. An electronic component including the semiconductor device described in the above embodiments is provided in the housing 921 and the remote controller 924. Thus, the television device can consume less power and operate at high speed.

Figure 14D:
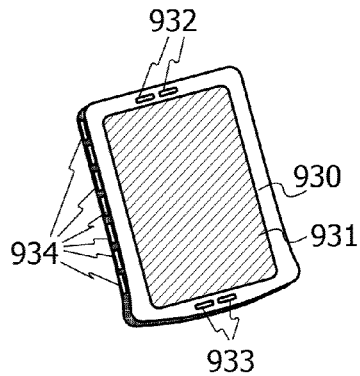

FIG. 14D illustrates a smartphone in which a main body 930 includes a display portion 931, a speaker 932, a microphone 933, operation buttons 934, and the like. An electronic component including the semiconductor device described in the above embodiments is provided in the main body 930. Thus, the smart phone can consume less power and operate at high speed.

Figure 14E:
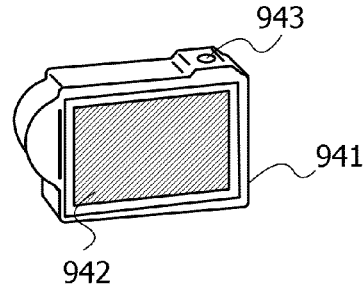

FIG. 14E illustrates a digital camera, which includes a main body 941, a display portion 942, an operation switch 943, and the like. An electronic component including the semiconductor device described in the above embodiments is provided in the main body 941. Thus, the digital camera can consume less power and operate at high speed.

As described above, an electronic component including the semiconductor device described in the above embodiments is provided in each of the electronic devices described in this embodiment. Thus, the electronic devices can consume less power and operate at high speed.

EXPLANATION OF REFERENCE

13: transistor, 15: transistor, 70: electron gun chamber, 72: optical system, 74: sample chamber, 76: optical system, 78: camera, 80: observation chamber, 82: film chamber, 84: electron, 88: substance, 92: fluorescent plate, 101: variable bias circuit, 102: transistor, 103: current source, 104: differential amplifier, 105: reference voltage source, 106: functional circuit, 107: transistor, 200: memory cell, 201: transistor, 202: transistor, 203: storage capacitor, 204: word line, 205: capacitor word line, 206: source line, 207: bit line, 208: back gate bias line, 209: driver circuit, 210: driver circuit, 301: PWM wave generation circuit, 302: constant voltage circuit, 303: inverter, 304: level shifter, 305: level shifter, 306: switch transistor, 307: switch transistor, 308: resistor, 309: capacitor, 400: substrate, 401: element isolation region, 402: impurity region, 403: impurity region, 404: channel formation region, 405: insulating film, 406: gate electrode, 411: insulating film, 412: conductive film, 413: conductive film, 414: conductive film, 416: conductive film, 417: conductive film, 418: conductive film, 420: insulating film, 421: insulating film, 422: insulating film, 424: gate electrode, 430: semiconductor film, 430a: oxide semiconductor film, 430b: oxide semiconductor film, 430c: oxide semiconductor film, 431: gate insulating film, 432: conductive film, 433: conductive film, 434: gate electrode, 501: triangle wave generation circuit, 502: comparator, 503: inverter buffer, 504: inverter buffer, 601: inverter, 602: switch, 603: NAND, 604: clock inverter, 605: switch, 606: inverter, 607: clock NAND, 608: multiplexer, 609: inverter, 610: oxide semiconductor transistor, 611: transistor, 612: transistor, 613: transistor, 614: capacitor, 615: capacitor, 616: wiring, 700: electronic component, 701: lead, 702: printed circuit board, 703: circuit portion, 704: circuit substrate, 901: housing, 902: housing, 903a: display portion, 903b: display portion, 904: selection button, 905: keyboard, 910: e-book reader, 911: housing, 912: housing, 913: display portion, 914: display portion, 915: hinge portion, 916: power switch, 917: operation key, 918: speaker, 920: television device, 921: housing, 922: display portion, 923: stand, 924: remote controller, 930: main body, 931: display portion, 932: speaker, 933: microphone, 934: operation button, 941: main body, 942: display portion, and 943: operation switch.

This application is based on Japanese Patent Application serial no. 2014-048276 filed with Japan Patent Office on Mar. 12, 2014, the entire contents of which are hereby incorporated by reference.

The invention claimed is:

1. A semiconductor device comprising:
a variable bias circuit;
a first transistor including a back gate;
a current source;
a differential amplifier;
a reference voltage source; and
a functional circuit,
wherein the functional circuit includes a second transistor including a back gate,
wherein each of the first transistor and the second transistor includes an oxide semiconductor,
wherein the current source is capable of supplying current between a source and a drain of the first transistor to generate a gate-source voltage in accordance with the current,
wherein the differential amplifier is capable of comparing the gate-source voltage of the first transistor and a voltage of the reference voltage source, amplifying a difference, and outputting a resulting voltage,
wherein the variable bias circuit includes a PWM wave generation circuit, and
wherein the variable bias circuit is capable of being controlled by one of the resulting voltage and an output current of the differential amplifier and supplying a voltage to the back gate of the first transistor and the back gate of the second transistor.

2. The semiconductor device according to claim 1, wherein the functional circuit is a memory circuit.

3. The semiconductor device according to claim 1, wherein the functional circuit is a register circuit.

4. A semiconductor device comprising:
a variable bias circuit;
a first transistor including a back gate;
a current source;
a differential amplifier;
a reference voltage source; and
a functional circuit,
wherein the functional circuit includes a second transistor including a back gate,
wherein each of the first transistor and the second transistor includes an oxide semiconductor,
wherein the current source is capable of supplying current between a source and a drain of the first transistor to generate a gate-source voltage in accordance with the current,
wherein the differential amplifier is capable of comparing the gate-source voltage of the first transistor and a voltage of the reference voltage source, amplifying a difference, and outputting a resulting voltage,
wherein the variable bias circuit is capable of being controlled by one of the resulting voltage and an output current of the differential amplifier and supplying a voltage to the back gate of the first transistor and the back gate of the second transistor, and wherein the variable bias circuit includes a PWM wave generation circuit, an inverter, a first level shifter, a second level shifter, a third transistor, a fourth transistor, and a low-pass filter.

5. The semiconductor device according to claim 4, wherein the PWM wave generation circuit includes a triangle wave generation circuit and a comparator.

6. The semiconductor device according to claim 5, wherein the PWM wave generation circuit further includes a first inverter buffer and a second inverter buffer.

7. The semiconductor device according to claim 4, wherein the functional circuit is a memory circuit.

8. The semiconductor device according to claim 4, wherein the functional circuit is a register circuit.

* * * * *